United States Patent
Park et al.

(10) Patent No.: US 7,412,575 B2
(45) Date of Patent: Aug. 12, 2008

(54) DATA MANAGEMENT TECHNIQUE FOR IMPROVING DATA RELIABILITY

(75) Inventors: Jong-Yeol Park, Goyang-si (KR); Hyun-Duk Cho, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 146 days.

(21) Appl. No.: 11/156,721

(22) Filed: Jun. 21, 2005

(65) Prior Publication Data

US 2006/0107127 A1    May 18, 2006

(30) Foreign Application Priority Data

Nov. 3, 2004   (KR) .................... 10-2004-0088988

(51) Int. Cl.
*G06F 12/00* (2006.01)
(52) U.S. Cl. .................. 711/159; 711/103; 711/104; 711/105; 711/154; 711/165; 711/170; 714/5; 714/6; 714/7; 714/8
(58) Field of Classification Search ......... 711/154–159, 711/103, 104, 105, 165, 170; 714/100, 699, 714/5, 6, 7, 8
See application file for complete search history.

(56) References Cited

U.S. PATENT DOCUMENTS

| | | | |
|---|---|---|---|
| 4,930,129 A | | 5/1990 | Takahira |
| 6,058,047 A | * | 5/2000 | Kikuchi ................. 365/185.33 |
| 6,604,214 B1 | * | 8/2003 | Fukushima ................. 714/746 |
| 6,684,289 B1 | | 1/2004 | Gonzalez et al. |
| 2003/0016596 A1 | | 1/2003 | Chiquoine et al. |

FOREIGN PATENT DOCUMENTS

| | | |
|---|---|---|
| KR | 1020000020028 A | 4/2000 |
| KR | 1020030017310 A | 3/2003 |
| KR | 1020040038709 A | 5/2004 |

* cited by examiner

*Primary Examiner*—Stephen Elmore
(74) *Attorney, Agent, or Firm*—Volentine & Whitt, PLLC.

(57) ABSTRACT

A method for managing data stored in a non-volatile memory having a plurality of memory blocks includes, first, determining if an error occurs in the read data in a selected memory block. If an error occurs in the read data in the selected memory block, then a region to which the selected memory block belongs is determined. If the selected memory block belongs to a code data region, it is determined if the number of bit errors of the read data is less than or equal to an allowed number of bit errors. If number of bit errors of the read data is less than or equal to the allowed number of bit errors, the selected memory block of the code data region is replaced with a reserved memory block, and the selected memory block of the code data region is designated to a user data region.

23 Claims, 3 Drawing Sheets

DATA MANAGEMENT TECHNIQUE FOR IMPROVING DATA RELIABILITY

CROSS-REFERENCE TO RELATED APPLICATIONS

This U.S. non-provisional patent application claims priority under 35 U.S.C. § 119 of Korean Patent Application 2004-88988 filed on Nov. 3, 2004, the entire contents of which are hereby incorporated by reference.

BACKGROUND OF THE INVENTION

The present invention relates to a semiconductor memory device, more particularly, to a technique for managing data stored in a non-volatile memory device.

Techniques for detecting and correcting errors enable damaged data due to various reasons to be effectively restored. For example, data may be damaged due to various reasons in a process for storing data in a memory, and due to perturbations of a channel for transferring data from a source to a destination. A number of methods have been suggested for detecting and correcting the damaged data. Commonly used techniques for detecting errors include a Reed-Solomon RS code, a Hamming code, a Bose-Chaudhuri-Hocquenghem (BCH) code and a Cyclic Redundancy (CRC) code. It is possible to detect damaged data using these codes, and to correct the errors in the data. In most fields to which a non-volatile memory device is applied, data is stored in a non-volatile memory device along with a value called an error correcting code (referred to hereinafter as "ECC").

ECC data is provided for correcting an error occurring during a read operation of a non-volatile memory device. The maximum number of correctable bit errors using the ECC data is limited. The ECC data for correcting a single bit error is stored in a general non-volatile memory device. Accordingly, the single bit error occurring during a data read operation may be corrected by techniques for detecting and correcting an error without additional restoration processes such as a block replacement.

In the data where a single bit error is corrected, it is likely that additional errors occur in the next read operation. If the number of bit errors of the read data exceeds an allowed number of bit errors, a memory block including the read data is replaced with a reserved memory block provided in a non-volatile memory device by additional restoration methods known as a block replacement method. At this time, the data in the replaced memory block will be copied to a reserved memory block. If the read data includes an allowable number of bit errors, an error of the read data is corrected by the dedicated techniques for detecting and correcting errors. Even if an error of the read data is corrected, it is likely that additional errors occur in error-corrected data during a read operation. Therefore, a technique for improving the reliability of error-corrected data is required.

SUMMARY OF THE INVENTION

According to one aspect of the present invention, a method for managing data stored in a non-volatile memory having a plurality of memory blocks comprises determining when a data error occurs in read data in a selected memory block; when a data error occurs in the read data of the selected memory block, determining to which data region the selected memory block belongs; when the selected memory block is a code data region, determining whether a number of bit errors of the read data is less than or equal to an allowed number of bit errors; and when the number of bit errors of the read data is less than or equal to the allowed number of bit errors, replacing the selected memory block of the code data region with a reserved memory block, and designating the selected memory block of the code data region to a user data region.

In an exemplary embodiment, a reserved memory block used for replacing the selected memory block is designated to the code data region.

In an exemplary embodiment, the data stored in the selected memory block, except for the read data, is copied to the replacement memory block.

In an exemplary embodiment, an error correcting code block automatically corrects bit error(s) of the read data, and the error-corrected data is stored in the replaced memory block.

In an exemplary embodiment, if the number of bit errors in the read data is less than or equal to the allowed number of bit errors, the selected memory block of the code data region is replaced with a reserved memory block.

In an exemplary embodiment, if the number of bit errors in the read data is greater than the allowed number of bit errors, the selected memory block of the code data region is replaced with a reserved memory block.

In an exemplary embodiment, if the number of bit errors in the read data is greater the allowed number of bit errors, the selected memory block of the code data region is replaced with a reserved memory block.

In an exemplary embodiment, the data stored in the selected memory block of the code data region is newly loaded, and the newly loaded data is stored in the replacement reserved memory block.

In an exemplary embodiment, if the selected memory block is the user data region, it is determined if the number of bit errors in the read data is greater the allowed number of bit errors.

In an exemplary embodiment, if the number of bit errors in the read data is greater the allowed number of bit errors, then the bit error(s) of the read data are automatically corrected by an error correcting code block.

In an exemplary embodiment, the number of bit errors in the read data is greater the allowed number of bit errors, the selected memory block is replaced with a reserved memory block.

In an exemplary embodiment, the selected memory block is designated to be a defective memory block.

According to another aspect of the present invention, a method for managing data stored in a non-volatile memory having a plurality of memory blocks comprises determining whether a data error occurs in read data of a selected memory block; and when an error occurs in the read data of the selected memory block, treating the error differently in accordance with whether the selected data block belongs to a code region or a user data region of the memory.

In an exemplary embodiment, the step of treating the error differently comprises when the selected memory block is in the code data region, determining whether a number of bit errors of the read data is less than or equal to an allowed number of bit errors; and when the number of bit errors of the read data is less than or equal to the allowed number of bit errors, replacing the selected memory block in the code data region with a reserved memory block, and designating the selected memory block of the code data region to the user data region.

In an exemplary embodiment, a reserved memory block used for replacing the selected memory block is designated to the code data region.

In an exemplary embodiment, the data stored in the selected memory block except for the read data is copied to the replacement memory block.

In an exemplary embodiment, an error correcting code block automatically corrects one or more bit error(s) of the read data, and the error-corrected data is stored in the replacement memory block.

In an exemplary embodiment, the step of treating the error differently further comprises, if the number of bit errors of the read data is greater than the allowed number of bit errors, replacing the selected memory block in the code data region with a reserved memory block.

In an exemplary embodiment, the step of treating the error differently further comprises, if the number of bit errors of the read data is greater than the allowed number of bit errors, designating the selected memory block of the code data region to a defective memory block.

In an exemplary embodiment, the data stored in the selected memory block of the code data region is newly loaded, and the newly loaded data is stored in the replacement reserved memory block.

In an exemplary embodiment, the step of treating the error differently further comprises, if the selected memory block is the user data region, determining if the number of bit errors in the read data exceeds an allowed number of bit errors.

In an exemplary embodiment, if the number of bit errors in the read data does not exceed an allowed number of bit errors, automatically correcting one or more errors of the read data with an error correcting code block.

In an exemplary embodiment, the step of treating the error differently further comprises, if the number of bit errors in the read data exceeds an allowed number of bit errors, replacing the selected memory block with a reserved memory block.

In an exemplary embodiment of the present invention, the selected memory block is designated to be a defective memory block.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

The present invention will now be described more fully hereinafter with reference to the accompanying drawings, in which preferred embodiments of the invention are shown.

Figure 1:
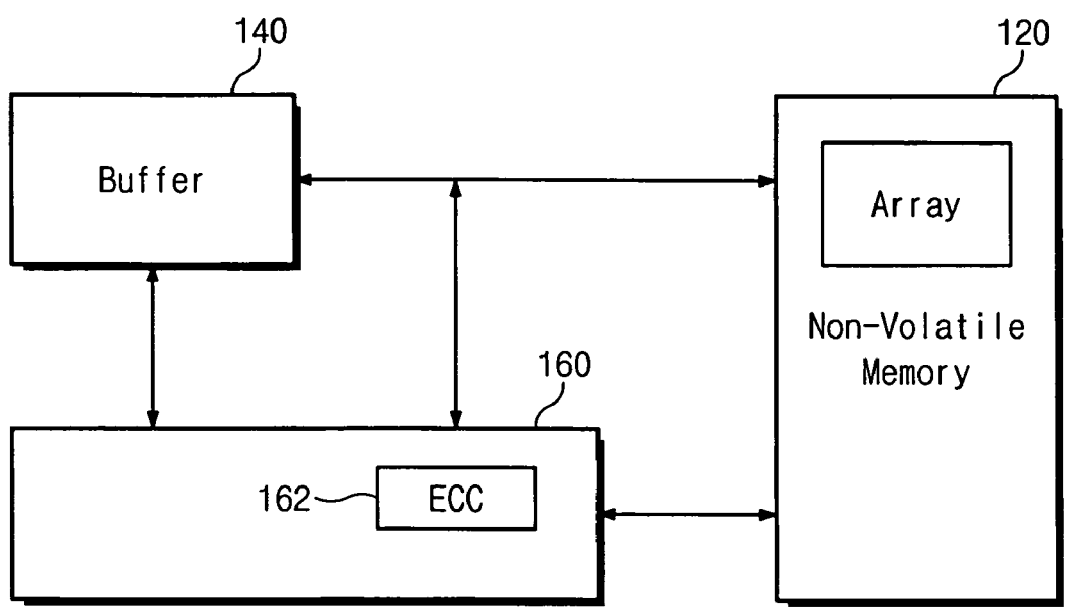
FIG. 1 is a block diagram schematically illustrating a non-volatile memory device in accordance with one or more aspects of the present invention.

FIG. 1 is a block diagram schematically illustrating a non-volatile memory device 100. The non-volatile memory device 100 of FIG. 1 is a NAND flash memory device. However, the principles of FIG. 1, as explained in further detail below, can be applied to other memory devices, for example, MROM, PROM, FRAM, NOR flash memory devices, and so on.

Figure 2:
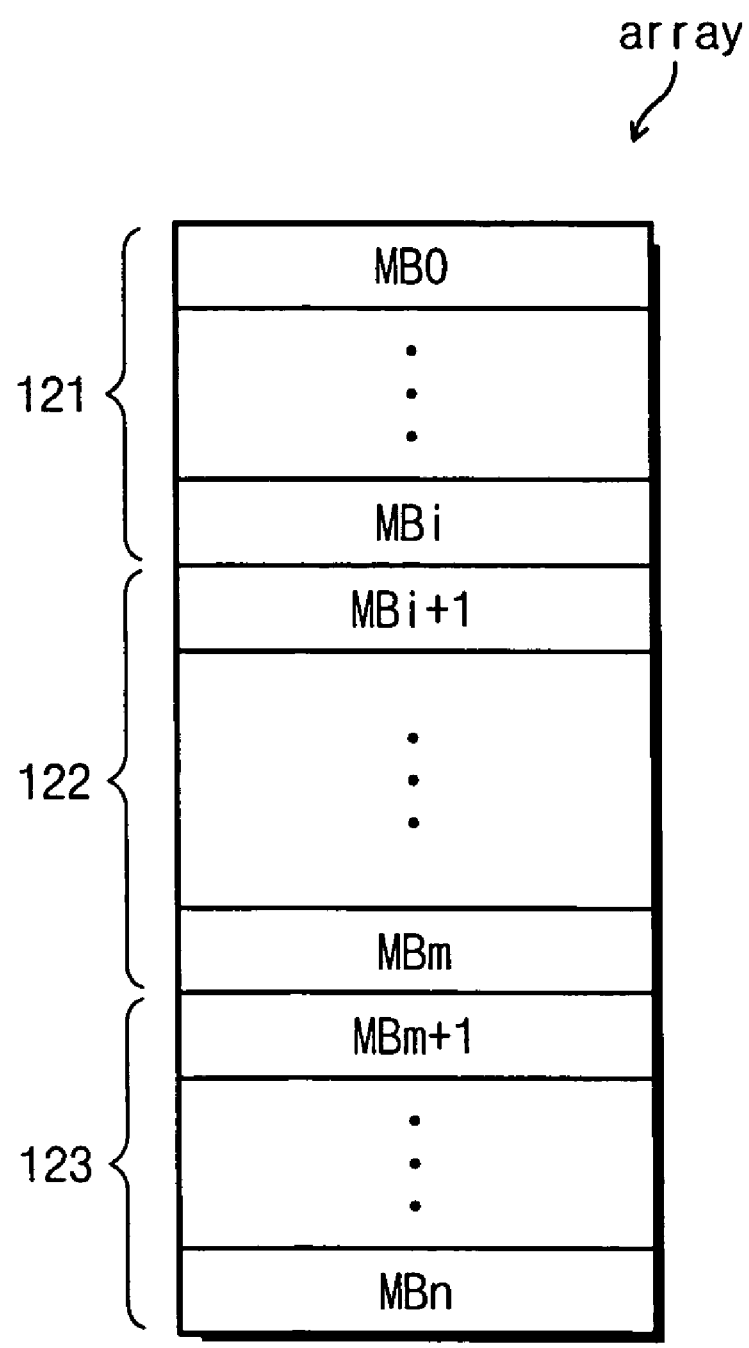
FIG. 2 is a view showing an array structure of the non-volatile memory device shown in FIG. 1.

Referring to FIG. 1, a non-volatile memory device 100 includes a non-volatile memory 120, a buffer memory 140 and a control circuit 160. As shown in FIG. 2, the non-volatile memory 120 includes a memory cell array having a first memory region 121, a second memory region 122 and a third memory region 123.

Each of the first through the third memory regions 121, 122 and 123 includes memory blocks, and each memory block includes a plurality of pages. Code data, such as an application program, is stored in a first memory region 121 as a code data region, and user data as general data is stored in a second memory region 122 as a user data region. The third memory region 123 is a reserved memory region for replacing memory block(s) of the first and the second memory regions 121 and 122. The buffer memory 140 is used for temporarily storing the read data from a non-volatile memory 120 and the data to be stored in the non-volatile memory 120. The control circuit 160 is configured to control operations of the non-volatile memory 120 and the buffer memory 140, for example, a read operation and a write operation. The control circuit 160 includes an error correcting code (ECC) block 162. The ECC block 162 produces ECC data related to data to be written, when the data to be written is transferred from the buffer memory 140 to the non-volatile memory 120. The ECC block 162 also detects if a data error occurs in the read data, when the read data is transferred from the non-volatile memory 120 to the buffer memory 140. If a data error occurs in the read data, and the data error involves an allowed number of bit errors (or less) for the ECC block 162, the ECC block 162 corrects the error(s) in the read data. The correctable number of error bits in the ECC block 162 is determined in advance. For example, in one embodiment the ECC block 162 is configured to correct a 1-bit error (single bit) corresponding to the allowed number of bit errors. However, the ECC block 162 is not limited to an embodiment that can correct only a single bit error.

In FIG. 1, the non-volatile memory 120, the buffer memory 140 and the control circuit 160 may be embodied in a single integrated circuit. Alternatively, the non-volatile memory 120, the buffer memory 140, and the control circuit 160 may be embodied with different integrated circuits to configure a memory system.

Figure 3:
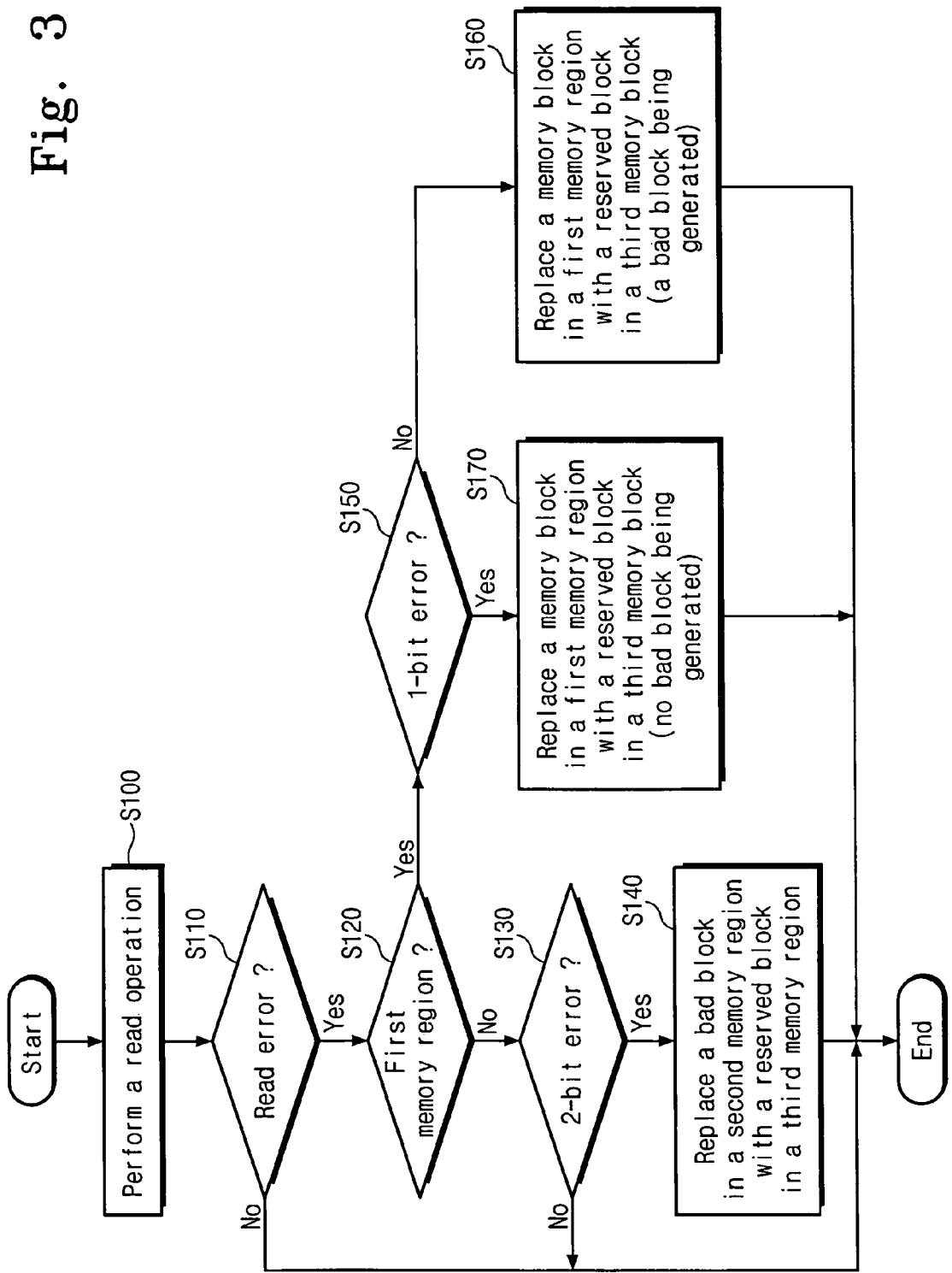
FIG. 3 is a flow chart illustrating a memory management method of the non-volatile memory device in accordance with the present invention.

FIG. 3 is a flow chart illustrating a memory management method of a non-volatile memory device such as the device 100 of FIG. 1. This memory management method of a non-volatile memory device will be described in detail with reference to the accompanying drawings.

A control circuit 160 controls a transfer of data from a non-volatile memory 120 to a buffer memory 140. In other words, a read operation is performed in accordance with controls of the control circuit 160 at step "S100". For convenience' sake, assuming that data in the amount of a page (referred to hereinafter as "page data") is transferred from the non-volatile memory 120 to the buffer memory 140. The ECC block 162 of the control circuit 160 detects if a data error occurs in the read page data during transmission of data from the non-volatile memory 120 to the buffer page 140. If a data error does not occur in the read page data, a read operation will be normally ended. If a data error occurs in the read page data, the control circuit determines at step "S120" if the data error occurs in the first memory region 121 (i.e., a code data region). If not, the control circuit 160 determines at step "S130" if a 2-bit error (or greater-than-2-bit error) occurs. If the error occurring during the data read operation is not a 2-bit error (or greater-than-2-bit error), exceeding the allowed number of bit errors for the ECC block 162, the read operation will be normally ended. In other words, if the number of bit errors in the read page data in the second memory region 122 during a read operation is less than or equal to the allowed number of bit errors of the ECC block 162 (e.g., a 1-bit error), then the currently occurring error is detected and corrected by the ECC block 162 and the read operation is normally ended without additional restoration processes, such as a block replacement.

If a 2-bit error of the read page data in the second memory region 122 occurs, exceeding the allowed number of bit errors correctable by the ECC block 162, a memory block of the second memory region 122, including a page of the currently read data, is replaced with one of the memory blocks of the third memory region 123 at step "S140." At this time, the page data, except for the error page data, is copied to a memory block of the third memory region 123. Simultaneously, a memory block including the page data having the errors is designated as a defective memory block, and the replaced memory block is designated to a memory block of the second memory region 122. After the memory block including the error page data is replaced, the read operation will be ended. In other words, if an error occurring in the second memory region 122 at a read operation is a 2-bit error, the read operation will be ended after additional restoration processes, such as a block replacement, are performed.

Returning to S120 step, if a data error occurs in the first memory region 121, the control circuit 160 determines in a step "S150" if the currently occurring error is a 1-bit error that is less than or equal to the allowed number of bit errors of the ECC block 162. If the currently occurring error is not a 1-bit error, in other words, if a 2-bit error occurs in the first memory region 121, a memory block of the first memory region 121 including the page where the data error occurs, is replaced with a memory block of the third memory region 123 at a step "S160." At this time, the memory block where the 2-bit error occurs is designated as a defective memory block, and a reserved memory block of the third memory region 123 is designated to the first memory region 121. Here, newly input or loaded data, instead of data stored in a defective memory block of the first memory region 121, will be stored in a designated memory block instead of the defective memory block in accordance with a well-known method. Then, the read operation will be ended.

If the currently occurring error is less than or equal to the allowed number of bit errors in the ECC block 162, in other words, if a 1-bit error occurs in the first memory region 121, a memory block of the first memory region 121 is replaced with a memory block of the third memory region 123, and a memory block in the first memory region 121 is designated to a memory block of the second memory region 122 at a step "S170." When a memory block of the first memory region 121 is replaced with a memory block of the third memory region 123, the page data, except the page data where the error occurs, is coped to the newly designated memory block. The page data where the error occurs is corrected by the ECC block 162, and the error-corrected page data also is copied to the newly designated memory block. Then, the read operation will be ended.

As shown in the above description, if a 1-bit error (belonging to the allowed number of bit errors of the ECC block) occurs in the first memory region 121, page data of a memory block of the first memory region 121 where a 1-bit error occurs is copied to a memory block corresponding to a third memory region 123. A memory block in the first memory region 121 where a 1-bit error occurs is designated to a memory block of the second memory region 122. This means that the reliability of data stored in the first memory region 121 can be improved. In other words, whenever a 1-bit error occurs in the first memory region, a memory block of the first memory block is replaced with a reserved memory block, thereby uniformly maintaining a probability of a 1-bit error occurring in one page. Accordingly, the reliability of data stored in the first memory region 121 can be improved.

In an embodiment, memory blocks of the third memory region are configured to be used regardless of whether they are being used for the first region and the second region. However, the memory blocks of the third memory region are configured so that some memory blocks can be replaced by memory blocks of the first memory region, and the other memory blocks can be replaced with memory blocks of the second memory block.

While a configuration and an operation of a circuit according to the present invention have been illustrated in the above description and the accompanying drawings, but these embodiments are provided as teaching examples of the invention. It is possible to make various changes and modifications without departing from the scope of the present invention.

As described above, the reliability of data or code data stored in the first memory region can be improved by treating errors of the first memory region and the second memory region differently.

What is claimed is:

1. A method for managing data stored in a non-volatile memory having a plurality of memory blocks comprising:
    determining when a data error occurs in read data in a selected memory block;
    when a data error occurs in the read data of the selected memory block, determining to which data region the selected memory block belongs;
    when the selected memory block is a code data region, determining whether a number of bit errors of the read data is less than or equal to an allowed number of bit errors; and
    when the number of bit errors of the read data is less than or equal to the allowed number of bit errors, replacing the selected memory block of the code data region with a reserved memory block, and designating the selected memory block of the code data region to a user data region.

2. The method of claim 1, wherein a reserved memory block used for replacing the selected memory block is designated to the code data region.

3. The method of claim 1, wherein the data stored in the selected memory block, except for the read data, is copied to the replaced memory block.

4. The method of claim 3, wherein the bit errors of the read data is automatically corrected by an error correcting code block, and the error-corrected data also is stored in the replaced memory block.

5. The method of claim 1, further comprising, when the number of bit errors of the read data is greater than an allowed number of bit errors, replacing the selected memory block of the code data region with the reserved memory block.

6. The method of claim 5, further comprising, when the number of bit errors of the read data is greater than the allowed number of bit errors, designating the selected memory block of the code data region to be a defective memory block.

7. The method of claim 6, wherein the data stored in the selected memory block of the code data region is stored in the reserved memory block.

8. The method of claim 1, further comprising, when the selected memory block is in the user data region, determining whether the number of bit errors of the read data exceeds an allowed number of bit errors.

9. The method of claim 8, further comprising, when the number of bit errors of the read data in the user data region does not exceed an allowed number of bit errors, automatically correcting the bit errors of the read data using an error correcting code block.

10. The method of claim 8, further comprising, when the number of bit errors of the read data in the user region exceeds the allowed number of bit errors, replacing the selected memory block with a reserved memory block.

11. The method of claim 10, further comprising, when the number of bit errors of the read data in the user region exceeds the allowed number of bit errors, designating the selected memory block to be a defective memory block.

12. A method for managing data stored in a non-volatile memory having a plurality of memory blocks comprising:
    determining whether a data error occurs in read data of a selected memory block; and
    when an error occurs in the read data of the selected memory block, treating the error differently in accordance with whether the selected data block belongs to a code region or a user data region of the memory.

13. The method of claim 12, wherein the step of treating the error differently comprises:
    when the selected memory block is in the code data region, determining whether a number of bit errors of the read data is less than or equal to an allowed number of bit errors; and
    when the number of bit errors of the read data is less than or equal to the allowed number of bit errors, replacing the selected memory block in the code data region with a reserved memory block, and designating the selected memory block of the code data region to the user data region.

14. The method of claim 13, wherein a reserved memory block used for replacing the selected memory block is designated to the code data region.

15. The method of claim 13, wherein the data stored in the selected memory block, except for the read data, is copied to the replaced memory block.

16. The method of claim 13, wherein an error of the read data is automatically corrected by an error correcting code block, and the error-corrected data is stored in the replaced memory block.

17. The method of claim 13, wherein the step of treating the error differently further comprises, when the number of bit errors of the read data is greater than an allowed number of bit errors, replacing the selected memory block in the code data region with a reserved memory block.

18. The method of claim 17, wherein the step of treating the error differently further comprises, when the number of bit errors of the read data is greater than the allowed number of bit errors, designating the selected memory block of the code data region to be a defective memory block.

19. The method of claim 18, wherein the data stored in the selected memory block of the code data region is stored in the replaced reserved memory block.

20. The method of claim 13, wherein the step of treating the error differently further comprises, when the selected memory block is in the user data region, determining whether the number of bit errors of the read data exceeds the allowed number of bit errors.

21. The method of claim 20, wherein the step of treating the error differently further comprises, when the number of bit errors of the read data does not exceed the allowed number of bit errors, automatically correcting the bit errors of the read data with an error correcting code block.

22. The method of claim 20, wherein the step of treating the error differently further comprises, when the number of bit errors of the read data exceeds the allowed number of bit errors, replacing the selected memory block with a reserved memory block.

23. The method of claim 22, wherein the selected memory block is designated to be a defective memory block.

* * * * *